United States Patent
Cheng et al.

(10) Patent No.: US 9,761,488 B2
(45) Date of Patent: Sep. 12, 2017

(54) METHOD FOR CLEANING VIA OF INTERCONNECT STRUCTURE OF SEMICONDUCTOR DEVICE STRUCTURE

(71) Applicant: Taiwan Semiconductor Manufacturing Co., Ltd, Hsin-Chu (TW)

(72) Inventors: Tai-Shin Cheng, Hsinchu (TW); Che-Cheng Chang, New Taipei (TW); Wei-Ting Chen, Hsinchu (TW); Wei-Yin Shiao, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/802,734

(22) Filed: Jul. 17, 2015

(65) Prior Publication Data

US 2017/0018458 A1    Jan. 19, 2017

(51) Int. Cl.
*H01L 21/76* (2006.01)
*H01L 21/768* (2006.01)
*H01L 21/311* (2006.01)
*H01L 21/02* (2006.01)
*H01L 21/027* (2006.01)

(52) U.S. Cl.
CPC .. *H01L 21/76883* (2013.01); *H01L 21/02063* (2013.01); *H01L 21/0276* (2013.01); *H01L 21/02178* (2013.01); *H01L 21/31116* (2013.01)

(58) Field of Classification Search
CPC ......... H01L 21/76883; H01L 21/02063; H01L 21/0276; H01L 21/31116; H01L 21/76811; H01L 21/76843; H01L 21/7685; H01L 21/76814; H01L 21/02041; H01L 21/02057; H01L 21/0206; H01L 21/02068; H01L 21/02172; H01L 21/02178
See application file for complete search history.

(56) References Cited

U.S. PATENT DOCUMENTS 4,172,004 A * 10/1979 Alcorn .............. H01L 21/32134
204/192.32
6,576,546 B2 * 6/2003 Gilbert .............. H01L 21/32051
257/E21.021

(Continued)

FOREIGN PATENT DOCUMENTS

JP    2004260001 A    9/2004
JP    2010517325 A    5/2010

(Continued)

*Primary Examiner* — Scott B Geyer
(74) *Attorney, Agent, or Firm* — Slater Matsil, LLP

(57) ABSTRACT

A method for forming the semiconductor device structure is provided. The method includes forming a metal layer in a first dielectric layer over a substrate and forming an etch stop layer over the metal layer. The etch stop layer is made of metal-containing material. The method also includes forming a second dielectric layer over the etch stop layer and removing a portion of the second dielectric layer to expose the etch stop layer and to form a via by an etching process. The method further includes performing a plasma cleaning process on the via and the second dielectric layer, and the plasma cleaning process is performed by using a plasma including nitrogen gas ($N_2$) and hydrogen gas ($H_2$).

23 Claims, 14 Drawing Sheets

(56) References Cited

U.S. PATENT DOCUMENTS

| | | | | |
|---|---|---|---|---|
| 6,635,528 B2 * | 10/2003 | Gilbert | | H01L 21/32139 257/E21.009 |
| 6,921,717 B2 * | 7/2005 | Kim | | H01L 21/02063 257/E21.576 |
| 6,998,275 B2 * | 2/2006 | Zhao | | C23C 16/34 257/E21.021 |
| 7,341,943 B2 * | 3/2008 | Yeh | | H01L 21/02063 257/E21.3 |
| 7,528,066 B2 | 5/2009 | Yang et al. | | |
| 7,700,479 B2 * | 4/2010 | Huang | | H01L 21/02063 257/E21.584 |
| 2002/0124867 A1 * | 9/2002 | Kim | | B08B 7/00 134/1.2 |
| 2002/0162736 A1 * | 11/2002 | Ngo | | H01L 21/02063 204/192.12 |
| 2003/0148618 A1 * | 8/2003 | Parikh | | H01L 21/76807 438/694 |
| 2003/0224595 A1 * | 12/2003 | Smith | | H01L 21/02063 438/637 |
| 2004/0175931 A1 | 9/2004 | Nishibe et al. | | |
| 2006/0157079 A1 * | 7/2006 | Kim | | B08B 7/00 134/1.1 |
| 2006/0226119 A1 * | 10/2006 | Kannan | | B08B 7/0035 216/67 |
| 2008/0057700 A1 * | 3/2008 | Lee | | C23C 14/568 438/622 |
| 2008/0146029 A1 * | 6/2008 | Baks | | H01L 21/31116 438/671 |
| 2008/0179741 A1 | 7/2008 | Streck et al. | | |
| 2009/0142931 A1 * | 6/2009 | Wang | | H01L 21/02063 438/734 |
| 2015/0069620 A1 | 3/2015 | Chi et al. | | |

FOREIGN PATENT DOCUMENTS

| | | |
|---|---|---|
| TW | I402936 B | 7/2013 |
| TW | 201511101 A | 3/2015 |

* cited by examiner

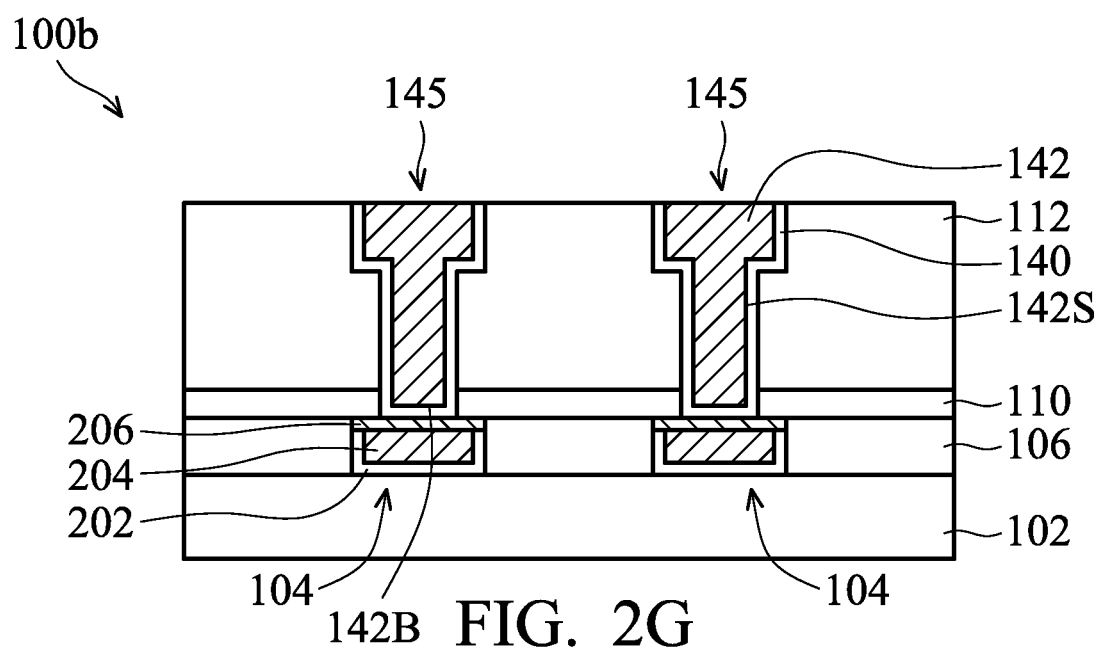

METHOD FOR CLEANING VIA OF INTERCONNECT STRUCTURE OF SEMICONDUCTOR DEVICE STRUCTURE

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

In the fabrication of semiconductor devices, the size of semiconductor devices has been continuously reduced in order to increase device density. Accordingly, a multi-layered interconnect structure is provided. The interconnect structure may include one or more conductive lines and via layers.

Although existing interconnect structures and methods of fabricating interconnect structures have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 2A-2G show cross-sectional representations of various stages of forming a semiconductor device structure with an interconnect structure, in accordance with some embodiments of the disclosure.

DETAILED DESCRIPTION

Figure 1A:
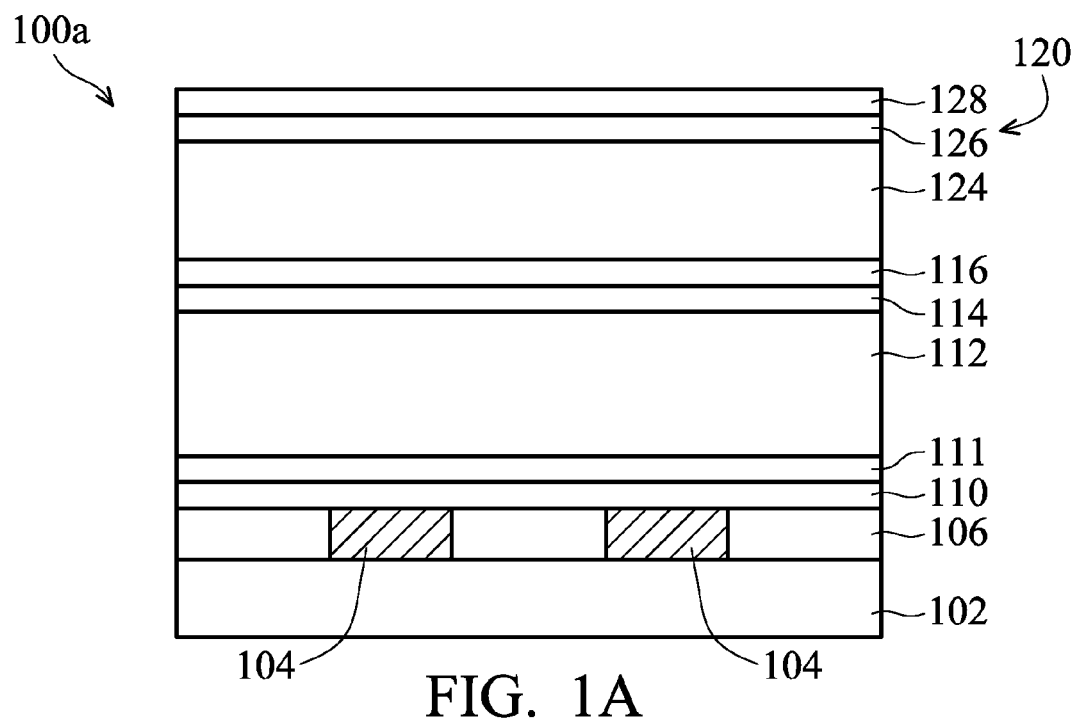
FIGS. 1A-1N show cross-sectional representations of various stages of forming a semiconductor device structure with an interconnect structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for forming a semiconductor structure with an interconnect structure are provided. The interconnect structure includes a number of metallization layers formed in a dielectric layer (such as inter-metal dielectric, IMD). One process for forming interconnect structures is the dual damascene process.

Figure 1B:
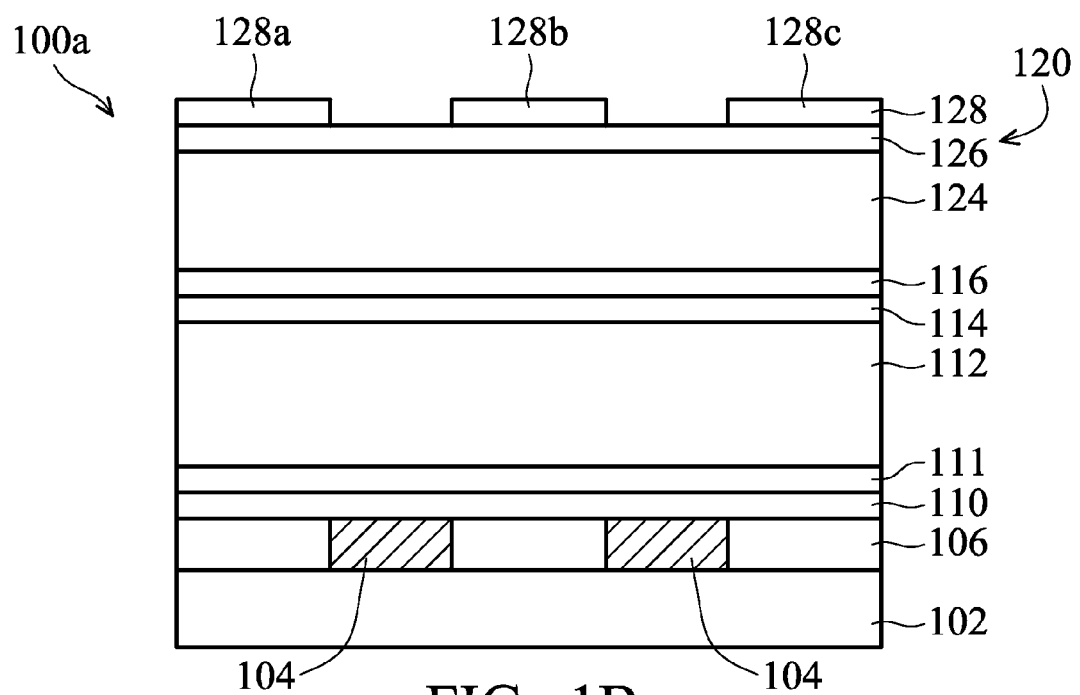
Figure 1C:
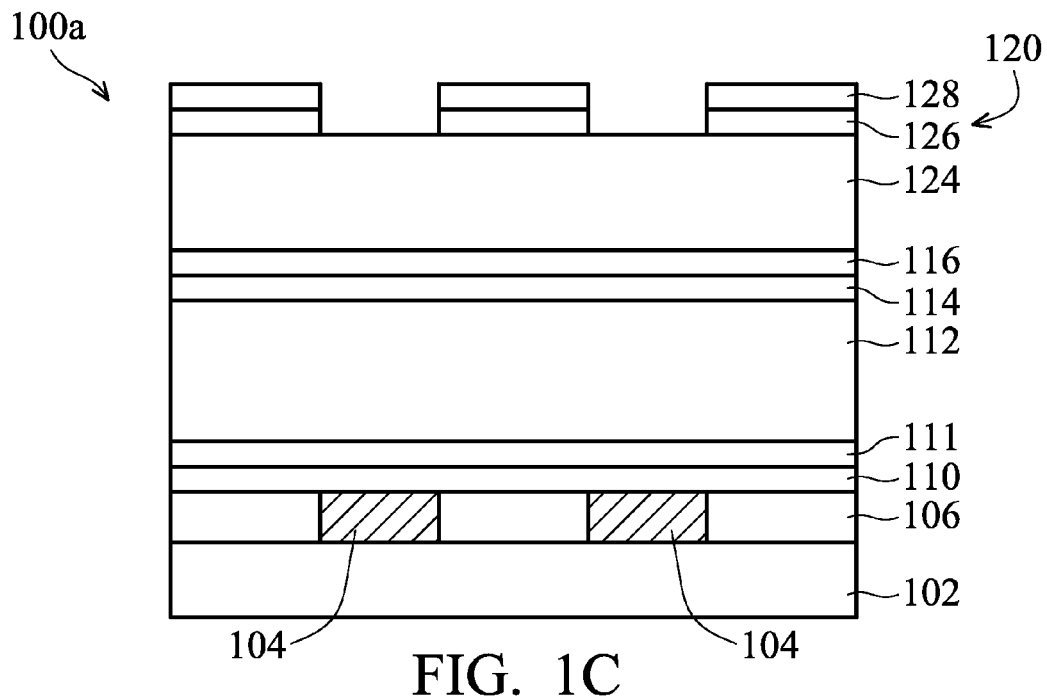
Figure 1D:
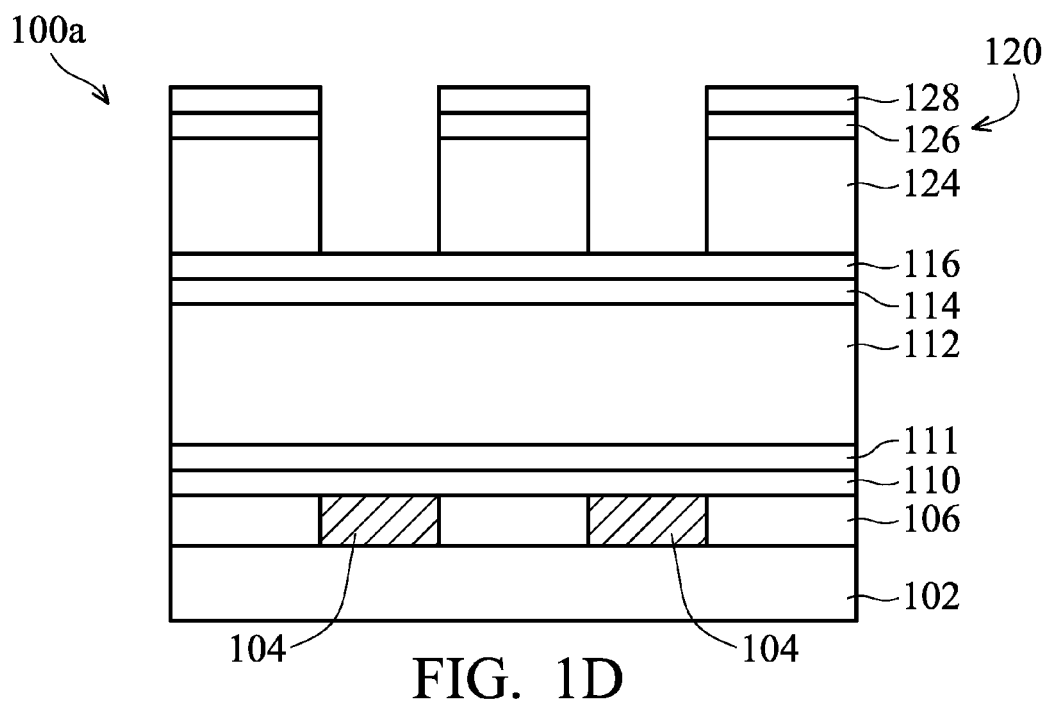
Figure 1E:
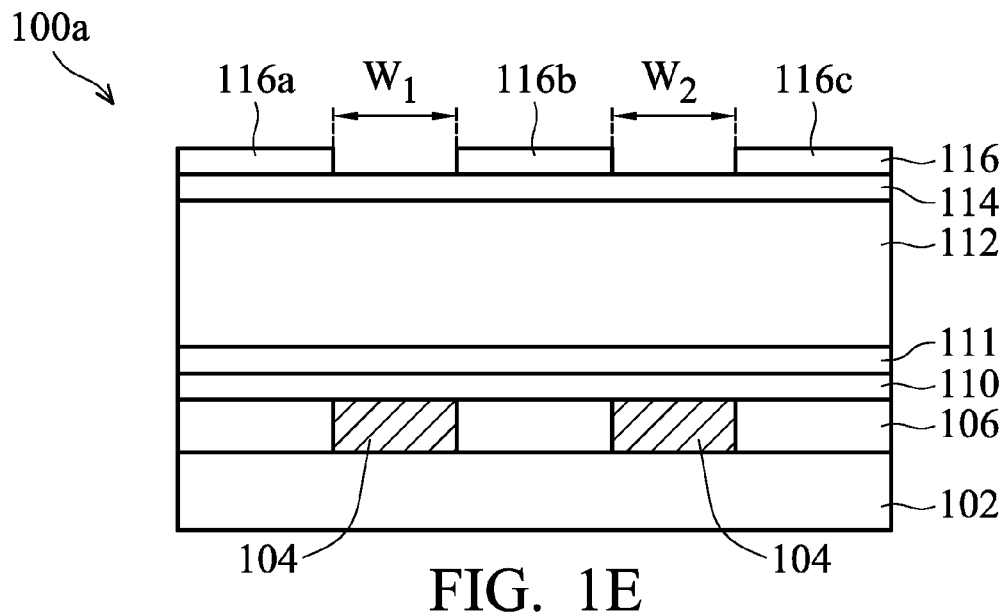
Figure 1F:
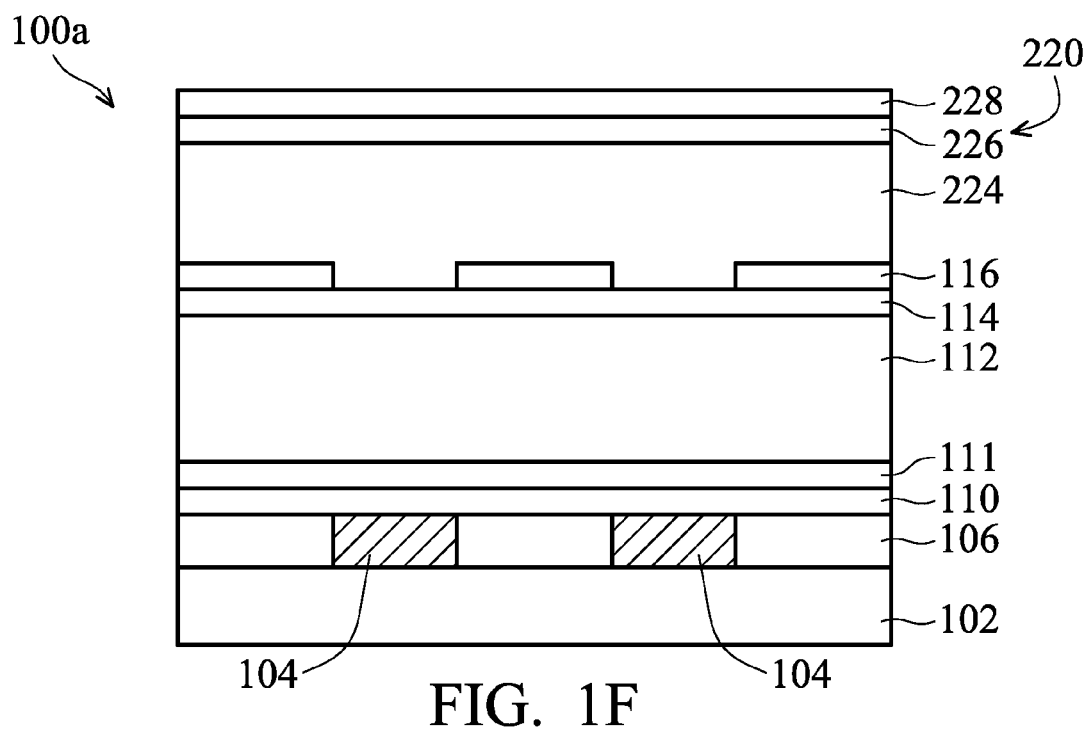
Figure 1G:
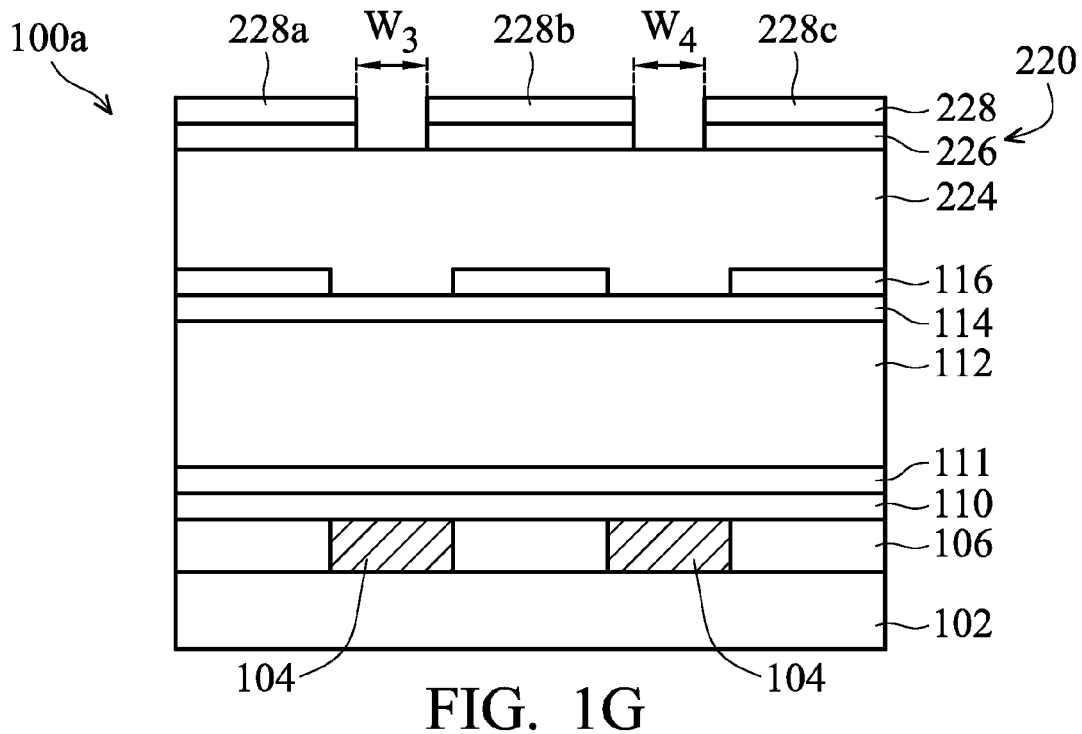
Figure 1H:
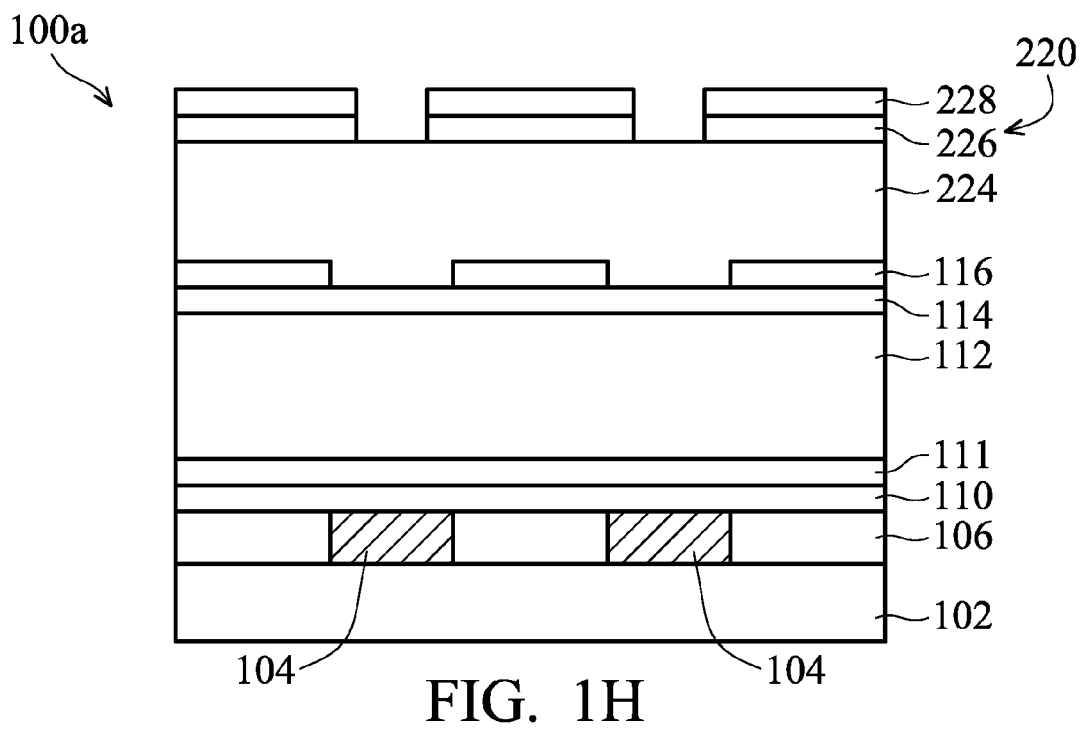
Figure 1I:
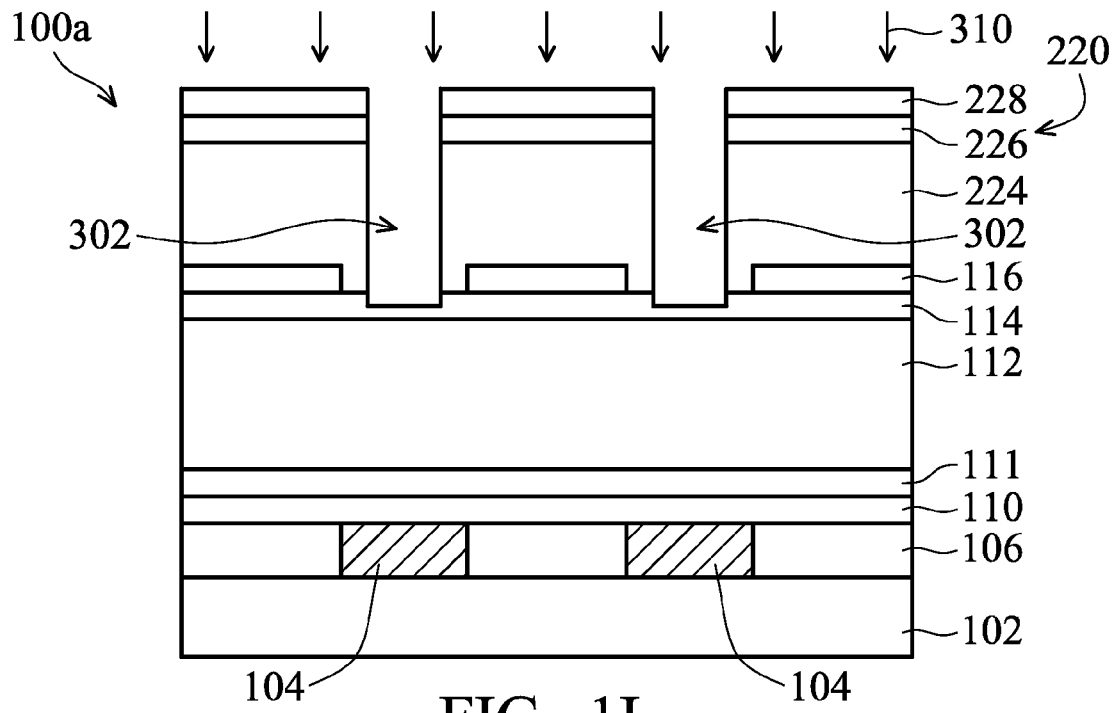
Figure 1J:
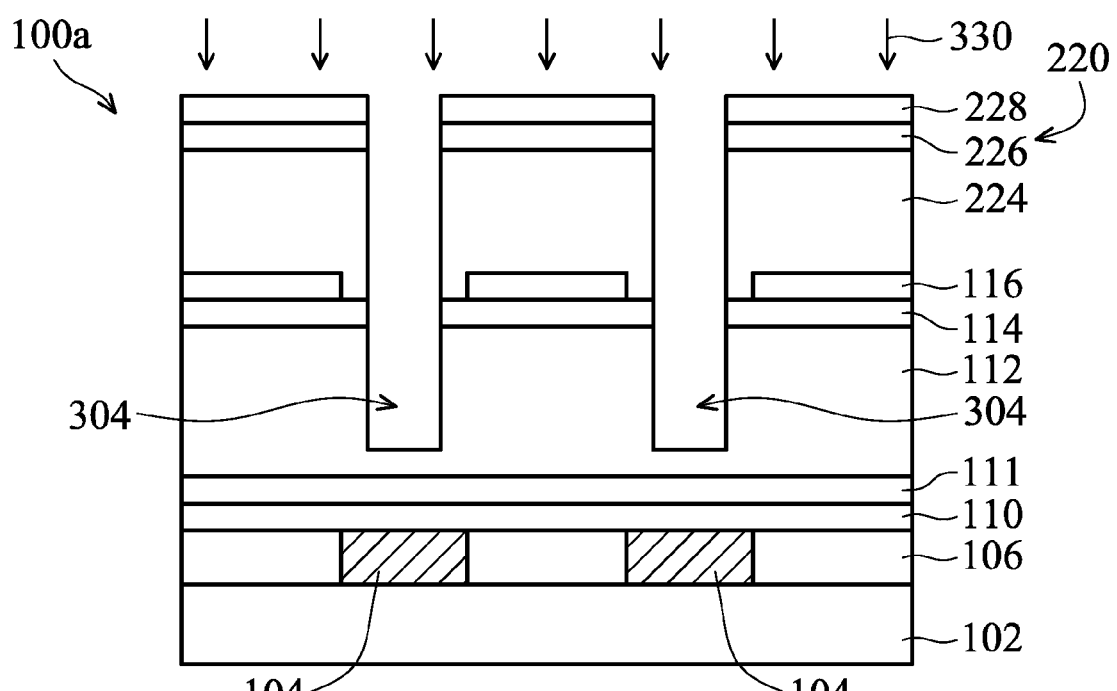
Figure 1K:
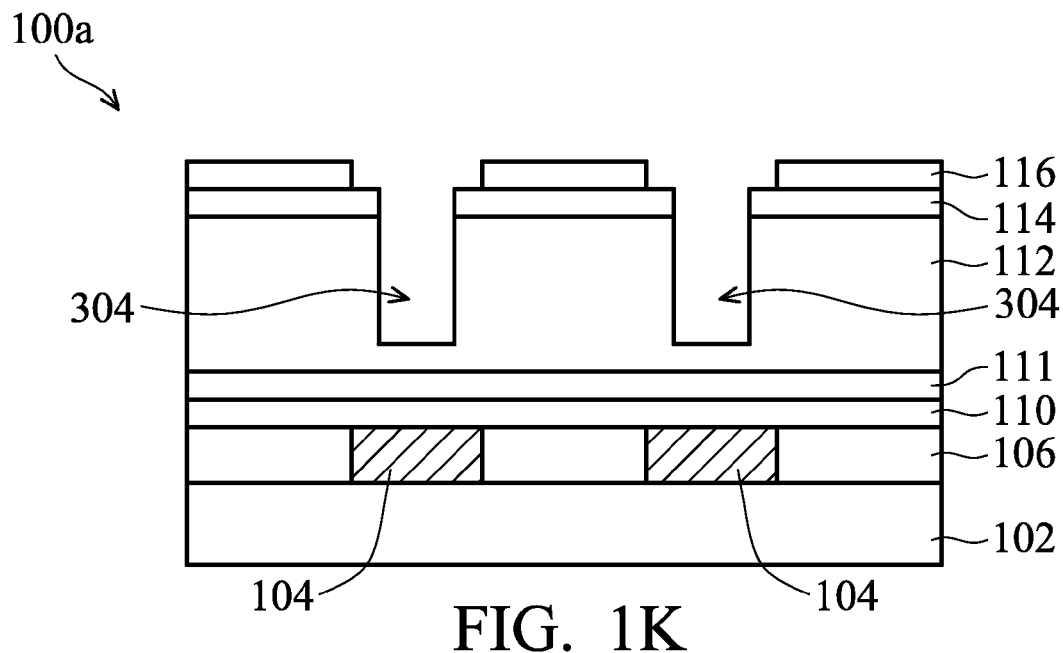
Figure 1L:
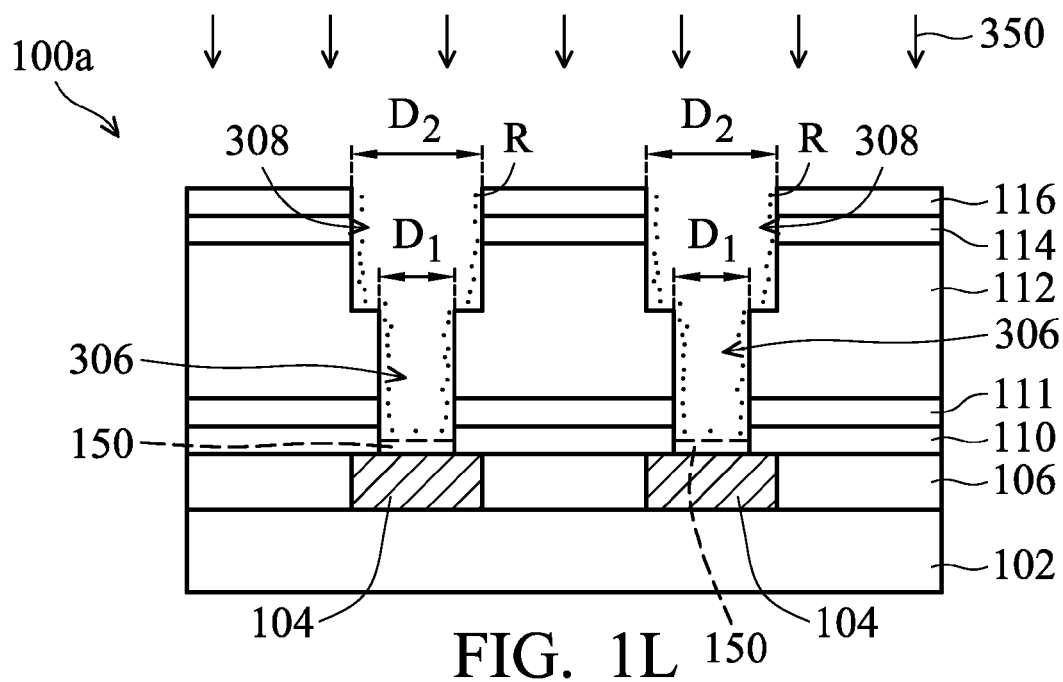
Figure 1M:
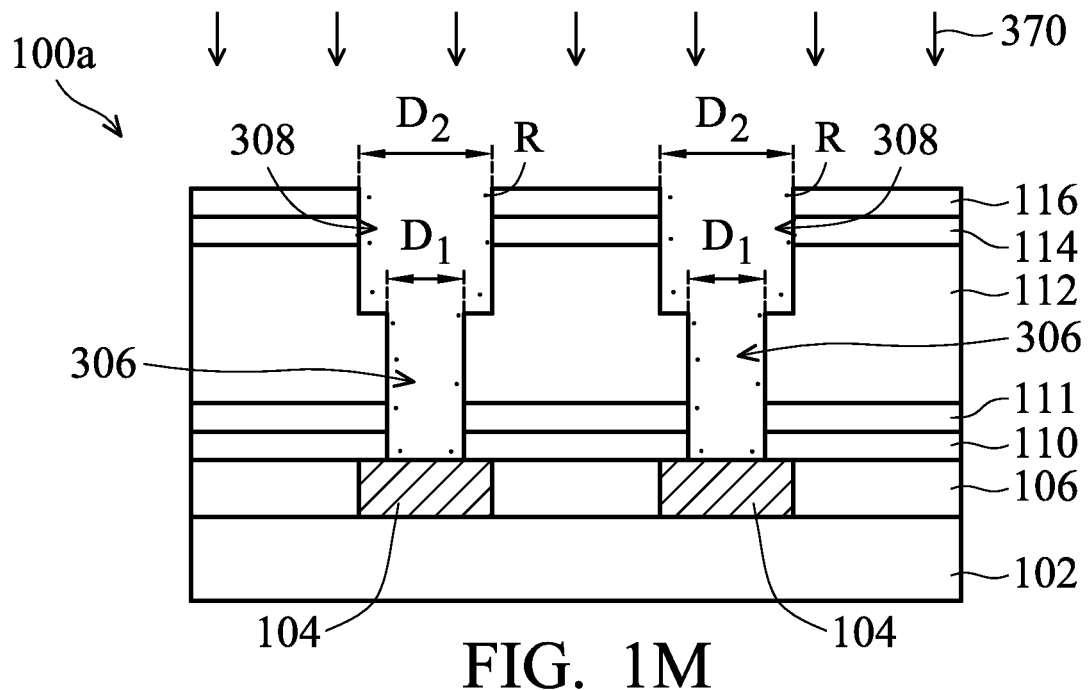
Figure 1N:
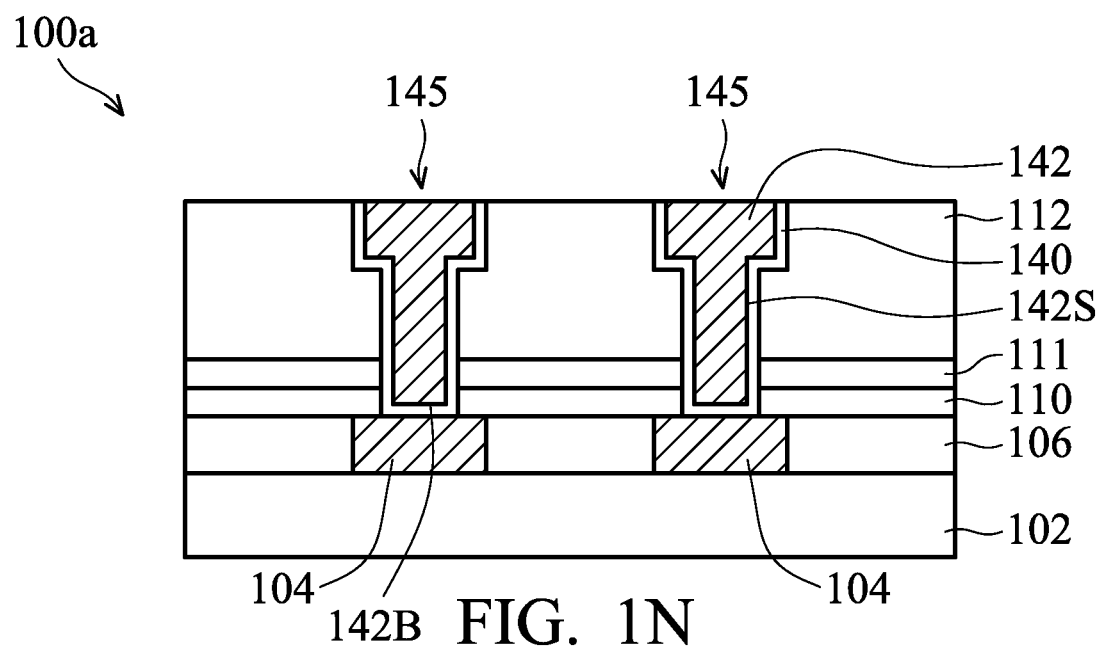

FIGS. 1A-1N show cross-sectional representations of various stages of forming a semiconductor device structure 100 with an interconnect structure, in accordance with some embodiments of the disclosure. FIGS. 1A-1N show a trench-first process for forming a dual damascene structure.

As shown in FIG. 1A, the semiconductor device structure 100 includes a substrate 102. The substrate 102 may be made of silicon or other semiconductor materials. Alternatively or additionally, the substrate 102 may include other elementary semiconductor materials such as germanium. In some embodiments, the substrate 102 is made of a compound semiconductor such as silicon carbide, gallium arsenic, indium arsenide, or indium phosphide. In some embodiments, the substrate 102 is made of an alloy semiconductor such as silicon germanium, silicon germanium carbide, gallium arsenic phosphide, or gallium indium phosphide. In some embodiments, the substrate 102 includes an epitaxial layer. For example, the substrate 102 has an epitaxial layer overlying a bulk semiconductor.

Some device elements (not shown) are formed in the substrate 102. Device elements include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n channel field effect transistors (PFETs/NFETs), etc.), diodes, and/or other applicable elements. Various processes are performed to form device elements, such as deposition, etching, implantation, photolithography, annealing, and/or other applicable processes. In some embodiments, device elements are formed in the substrate 102 in a front-end-of-line (FEOL) process.

The substrate 102 may include various doped regions such as p-type wells or n-type wells). Doped regions may be doped with p-type dopants, such as boron or $BF_2$, and/or n-type dopants, such as phosphorus (P) or arsenic (As). The doped regions may be formed directly on the substrate 102, in a P-well structure, in an N-well structure, or in a dual-well structure.

The substrate 102 may further include isolation features (not shown), such as shallow trench isolation (STI) features or local oxidation of silicon (LOCOS) features. Isolation features may define and isolate various device elements.

As shown in FIG. 1A, a first dielectric layer 106 (such as inter-metal dielectric, IMD) is formed on the substrate 102, and a first metal layer 104 is embedded in first dielectric layer 106. The first dielectric layer 106 and first metal layer 104 are formed in a back-end-of-line (BEOL) process.

The first dielectric layer 106 may be a single layer or multiple layers. The first dielectric layer 106 is made of silicon oxide (SiOx), silicon nitride (SixNy), silicon oxynitride (SiON), dielectric material(s) with low dielectric constant (low-k), or combinations thereof. In some embodiments, the first dielectric layer 106 is made of an extreme low-k (ELK) dielectric material with a dielectric constant (k) less than about 2.5. In some embodiments, ELK dielectric materials include carbon doped silicon oxide, amorphous fluorinated carbon, parylene, bis-benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), porous SiLK, or porous silicon oxide ($SiO_2$). In some embodiments, the dielectric layer 106 is deposited by a plasma enhanced chemical vapor deposition (PECVD) process or by a spin coating process.

In some embodiments, the first metal layer 104 is made of copper (Cu), copper alloy, aluminum (Al), aluminum alloy, tungsten (W), tungsten alloy, titanium (Ti), titanium alloy, tantalum (Ta) or tantalum alloy. In some embodiments, the first metal layer 104 is formed by a plating method.

An etch stop layer 110 is formed over the first dielectric layer 106. The etch stop layer 110 may be a single layer or multiple layers. The etch stop layer 110 protects the underlying layers, such as the first dielectric layer 106 and also provides improved adhesion for layers formed subsequently.

The etch stop layer 110 is made of a metal-containing material, such as aluminum-containing material. In some embodiments, the aluminum-containing material is aluminum nitride, aluminum oxide or aluminum oxynitride. The aluminum-containing material may increase the speed of the semiconductor device 100.

Afterwards, an adhesion layer 111 is formed over the etch stop layer 110. The adhesion layer 111 is configured to adherer the etching stop layer 110 to another dielectric layer thereon. The adhesion layer 111 is made of dielectric layer, such as silicon oxide formed by tetraethoxysilane (TEOS), or oxygen doped silicon carbide (SiC:O, ODC).

A second dielectric layer 112 is formed over the etch stop layer 110. The second dielectric layer 112 may be a single layer or multiple layers. The second dielectric layer 112 is made of silicon oxide (SiOx), silicon nitride (SixNy), silicon oxynitride (SiON), dielectric material(s) with low dielectric constant (low-k), or combinations thereof. In some embodiments, the second dielectric layer 112 is made of an extreme low-k (ELK) dielectric material with a dielectric constant (k) less than about 2.5.

An antireflection layer 114 and a hard mask layer 116 are sequentially formed over the second dielectric layer 112. In some embodiments, the antireflection layer 114 is made of nitrogen-free material, such as silicon oxycarbide (SiOC). In some embodiments, the hard mask layer 116 is made of a metal material, such as titanium nitride (TiN), tantalum nitride (TaN), or tungsten nitride (WN). The hard mask layer 116 made of metal material is configured to provide a high etch selectivity relative to the second dielectric layer 112 during the plasma process.

A tri-layer photoresist structure 120 is formed on the hard mask layer 116. The tri-layer photoresist structure 120 includes a bottom layer 124, a middle layer 126 and a top layer 128. In some embodiments, the bottom layer 124 is a bottom anti-reflective coating (BARC) layer which is used to reduce reflection during the photolithography process. In some embodiments, the bottom layer 124 is made of nitrogen-free material, such as silicon rich oxide, or silicon oxycarbide (SiOC). In some embodiments, the middle layer 126 is made of silicon-based material, such as silicon nitride, silicon oxynitride or silicon oxide.

The top layer 128 may be a positive photoresist layer or a negative photoresist layer. In some embodiments, the top layer 128 is made of Poly (methyl methacrylate) (PMMA), Poly (methyl glutarimide) (PMGI), Phenol formaldehyde resin (DNQ/Novolac) or SU-8. In some embodiments, the ratio of the thickness of the bottom layer 124 to the thickness of the middle layer 126 is in a range from about 4 to about 8.

Afterwards, the top layer 128 is patterned to form a patterned top layer 128 as shown in FIG. 1B, in accordance with some embodiments of the disclosure. The patterned top layer 128 includes a first portion 128a, a second portion 128b and a third portion 128c.

After the top layer 128 is patterned, the middle layer 126 is patterned by using the patterned top layer 128 as a mask as shown in FIG. 1C, in accordance with some embodiments of the disclosure. As a result, the pattern of the top layer 128 is transferred to the middle layer 126 to form the patterned middle layer 126.

After the middle layer 126 is patterned, the bottom layer 124 is patterned by using the patterned middle layer 126 as a mask as shown in FIG. 1D, in accordance with some embodiments of the disclosure.

Afterwards, the hard mask layer 116 is patterned by using the patterned bottom layer 124 as a mask as shown in FIG. 1E, in accordance with some embodiments of the disclosure. Afterwards, the tri-layer photoresist structure 120 is removed by an etching process. Therefore, the patterned hard mask layer 116 is obtained, and it includes a first portion 116a, a second portion 116b and a third portion 116c. The first width $W_1$ is formed between the first portion 116a and the second portion 116b0. The second width $W_2$ is formed between the second portion 116b and the third portion 116c. In some embodiments, the first width $W_1$ is substantially equal to the second width $W_2$.

After the hard mask layer 116 is patterned, a second photoresist structure 220 is formed over the patterned hard mask layer 116 as shown in FIG. 1F, in accordance with some embodiments of the disclosure. The second photoresist structure 220 includes a bottom layer 224, a middle layer 226 and a top layer 228.

The top layer 228 of the second photoresist structure 220 is firstly patterned to form a patterned top layer 228 as shown in FIG. 1G, in accordance with some embodiments of the disclosure. The patterned top layer 228 includes a first portion 228a, a second portion 228b and a third portion 228c. A third width $W_3$ is formed between the first portion 228a and the second portion 228b. A fourth width $W_4$ is formed between the second portion 228b and the third portion 228c. The third width $W_3$ is substantially equal to the fourth width $W_4$. The third width $W_3$ between the first portion 228a and the second portion 228b is smaller than the first width $W_1$ (as shown in FIG. 1E) between the first portion 116a and the second portion 116b of the patterned hard mask layer 116.

Afterwards, the middle layer 226 is pattered by using the patterned top layer 228 as a mask as shown in FIG. 1H, in accordance with some embodiments of the disclosure.

After the middle layer 226 is pattered, the bottom layer 224 and a portion of antireflection layer 114 is removed as shown in FIG. 1I, in accordance with some embodiments of the disclosure. The portion of antireflection layer 114 is removed by a first etching process 310 to form a recess 302.

The sidewalls of the recess 302 are vertical to the antireflection layer 114. The width of the first recess 302a is substantially equal to the width of the second recess 302b.

The first plasma process 310 includes using a first etch gas including oxygen gas ($O_2$), carbon dioxide ($CO_2$) or another applicable gas. In addition to gas, the first etching process 310 may be fine-tuned with various parameters, such as pressure, power, temperature and/or other suitable parameters.

After forming the first recess 302a and the second recess 302b, the antireflection layer 114 is etched through and a portion of the second dielectric layer 112 is removed by a second etching process 330 as shown in FIG. 1J, in accordance with some embodiments of the disclosure.

As a result, the recess 302 is elongated to form an opening 304. It should be noted that the sidewall of the opening 304 is vertical to the second dielectric layer 112. In other words, the opening 304 has a substantially vertical profile.

The second etching process 330 is performed by using a second etch gas including fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

Afterwards, the second photoresist structure 220 is removed as shown in FIG. 1K, in accordance with some embodiments of the disclosure. Therefore, the patterned hard mask layer 116 is exposed.

After the second photoresist structure 220 is removed, the second dielectric layer 112 and the etch stop layer 110 are etched through to expose the first metal layer 104 by a third etching process 350 as shown in FIG. 1L, in accordance with some embodiments of the disclosure.

Therefore, a via portion 306 and a trench portion 308 are formed and they collectively constitute a first trench-via structure for use as a dual damascene cavity. The via portion 306 has a first width $D_1$. In some embodiments, the first width $D_1$ is in a range from about 30 nm to about 60 nm. The trench portion 308 has a second width $D_2$. In some embodiments, the second width $D_2$ is greater than the first width $D_1$.

If the first width $D_1$ is smaller than 30 nm, the dimensions are too small to fill the conductive material. If the first width $D_1$ is greater than 60 nm, the pitch between two adjacent via portions may be smaller than the predetermined value.

As shown in FIG. 1L, the via portion 306 is vertical to the top surface of the first metal layer 104. In some embodiments, an angle between the sidewall of the via portion 306 and the top surface of the first metal layer 104 is in a range from about 85 degrees to about 95 degrees.

The third etching process 350 is performed by using a third etch gas including fluorine-containing gas, nitrogen ($N_2$), oxygen ($O_2$) or combinations thereof. The fluorine-containing gas includes nitrogen hexafluoroethane ($C_2F_6$), tetrafluoromethane ($CF_4$), trifluoromethane ($CHF_3$), difluoromethane ($CH_2F_2$), octofluoropropane ($C_3F_8$), octofluorocyclobutane ($C_4F_8$), or combinations thereof.

The third etch gas used in the third etching process 350 further includes a diluting gas, such as an inert gas, for example argon (Ar) or helium (He). The diluting gas is used to decrease the loading effect. In some embodiments, the ratio of the flow rate of diluting gas to the flow rate of the third etch gas is in a range from about 20/1 to about 40/1. In some embodiments, the flow rate of diluting gas is in a range from about 800 sccm to about 1000 sccm. If the ratio or the flow rate of diluting gas is too small, the loading effect may be serious. If the ratio or the flow rate of diluting gas is too high, the etching rate may be too slow, and the fabrication cost may increase.

It should be noted that during the third etching process 350, the fluorine element from the fluorine-containing gas may react with the material of the etch stop layer 110. As a result, a metal oxide layer 150, such as aluminum oxide (AlxOy) or aluminum-fluoride oxide (AlxFyOz)), may spontaneously form over the etch stop layer 110. In addition, some residue R or by-products may form over the etch stop layer 110 and the sidewalls of the via portion 306 and the trench portion 308.

However, if the metal oxide layer 150 and the residues R accumulate on the etch stop layer 110, the conductive path may be blocked. It means that the conductive material (formed later) cannot electrically connect to the first metal layer 104. As a result, the resistance of the interconnect structure may be undesirably increased.

In order to resolve the above-mentioned problem, a plasma cleaning process 370 is performed on the via portion 306, the trench portion 308, the etch stop layer 110, the adhesion layer 111, the second dielectric layer 112 and the antireflection layer 114 and the hard mask layer 116 as shown in FIG. 1M, in accordance with some embodiments of the disclosure. After the plasma cleaning process 370, the metal oxide layer 150 is removed and most of the residues R are removed.

The plasma cleaning process is performed by using a plasma including nitrogen gas ($N_2$) and hydrogen gas ($H_2$). The nitrogen gas is used to break or bombard some bonds in the metal oxide layer 150 and the residues R. The hydrogen gas is used to reduce the metal oxide layer 150 and the residues R. More specifically, the metal oxide layer 150 and the residues R are reduced by using the hydrogen gas as a reducing agent.

In some embodiments, a ratio of the flow rate of nitrogen gas ($N_2$) to the flow rate of hydrogen gas ($H_2$) is in a range from about 2/1 to about 4/1. If the ratio is smaller than 2/1, the breaking ability may be weak. If the ratio is greater than 4/1, the reducing ability may be weak.

In some embodiments, the pressure of the plasma cleaning process 370 is in a range from about 1 mtorr to about 200 mtorr. If the pressure of the plasma cleaning process 370 is less than 1 mtorr, the removal efficiency of the metal oxide layer 150 and the residues R may be poor. If the pressure of the third etching process 350 is greater than 100 mtorr, the etching uniformity may be poor and the etch critical dimension (CD) is difficult to control.

In some embodiments, the power of the plasma cleaning process 370 is in a range from about 0 W to about 400 W. If the power is greater than 400 W, the etching rate is too fast, and the critical dimension (CD) is difficult to control very well. As a result, the underlying first metal layer 104 may also be etched or damaged.

In some embodiments, the temperature of the plasma cleaning process 370 is in a range from about 10 degrees to about 100 degrees. If the temperature is smaller than 10 degrees, the removal efficiency of the metal oxide layer 150 and the residues R may be poor. If the temperature is greater than 100 degrees, the etching rate is too fast, and the critical dimension (CD) is difficult to control.

After the plasma cleaning process 370, a wet cleaning process is performed on the via portion 306, the trench portion 308, the etch stop layer 110, the adhesion layer 111, the second dielectric layer 112 and the antireflection layer 114 and the hard mask layer 116. The wet cleaning process is performed by using a cleaning solution. In some embodiments, the cleaning solution including an ozone in deionized water ($O_3$/DI) cleaning solution or a SPM cleaning solution, in accordance with some embodiments. The SPM cleaning solution includes a mixture of sulfuric acid, a hydrogen peroxide solution, and pure water. In some embodiments, the remaining metal oxide layer 150 and the remaining residues R are removed by the wet cleaning process.

Afterwards, the antireflection layer 114 and hard mask layer 116 are removed. In some embodiments, the antireflection layer 114 and hard mask layer 116 are removed by a chemical mechanical polishing (CMP) process.

Afterwards, a diffusion barrier layer 140 is formed in first trench-via structure and second trench-via structure, and a conductive feature 142 is formed on the diffusion barrier layer 140 as shown in FIG. 1N, in accordance with some embodiments of the disclosure.

The conductive feature 142 is formed in the second dielectric layer 112, and it is surrounded by the diffusion barrier layer 140. A conductive structure 145 is formed by filling the diffusion barrier layer 140 and the conductive feature 142 in the trench-via structure. The conductive feature 142 is electrically connected to the first metal layer 104. The first metal layer 104 embedded in the first dielectric layer 106 and the conductive feature 142 embedded in second dielectric layer 112 construct a portion of the interconnect structure.

In some embodiments, the diffusion barrier layer 140 may be made of titanium (Ti), titanium nitride (TiN), tantalum (Ta), tantalum nitride (TaN), or aluminum nitride (AlN). In some embodiments, the conductive feature 142 is made of copper, and the diffusion barrier layer 202 includes a TaN/Ta bi-layer.

It should be noted that the conductive feature 142 has a pair of sidewalls 142S connected to a bottom surface 142B. The sidewalls 142S are vertical to the bottom surface 142B.

In some embodiments, the width of the bottom profile of the via portion 306 is in a range from about 30 nm to about 100 nm. If the width is smaller than 30 nm, the conductive material is difficult to filled into the via portion 306. If the width is greater than 100 nm, the critical dimension (CD) may not meet requirements.

It should be noted that if the metal oxide layer 150 and residues R are remaining over the first metal layer 110, the resistance of the trench-via structure may be increased because the contact area between the first metal layer 104 and the trench-via structure is reduced. The increased resistance may lead to device failure.

In order to reduce the pollution problem, the plasma cleaning process 370 is performed after the third etching process 350. The third etching process 350 and the plasma cleaning process 370 are performed in the same chamber, and fabrication time is reduced. In other words, the first etching process 310, the second etching process 330 and the third etching process 350 and the plasma cleaning process 370 are performed in-situ without transferring to different chamber.

The bottom profile of the via portion 306a is not be destroyed by the plasma cleaning process 370. In other words, the bottom profile of the via portion 306a has no touching or under-cut profile. The bottom profile of the via portions 306 is not be changed by the plasma cleaning process 370, and the process window for filling conductive material may be maintained.

Furthermore, since the pollution is reduced by performing the plasma cleaning process 370, a quiet time (q-time) between the plasma cleaning process 370 and the wet cleaning process may be elongated.

FIGS. 2A-2G show cross-sectional representations of various stages of forming a semiconductor device structure 100b with an interconnect structure, in accordance with some embodiments of the disclosure. Semiconductor structure 100b is similar to, or the same as, semiconductor structure 100 shown in FIG. 1N, except the first metal layer 104 includes a diffusion barrier layer 202 and a conductive feature 204 and a capping layer 206. In addition, the adhesion layer 111 is not used in the semiconductor structure 100b. Processes and materials used to form semiconductor structure 100b may be similar to, or the same as, those used to form semiconductor structure 100 and are not repeated herein.

Figure 2A:
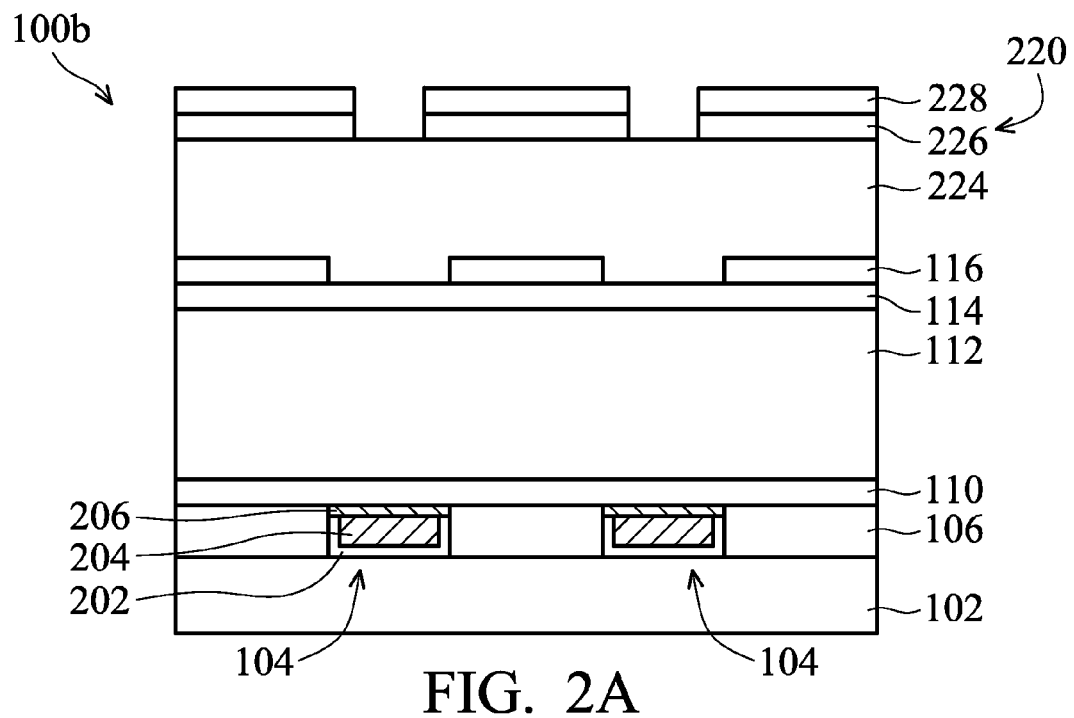

As shown in FIG. 2A, the conductive feature 204 is formed in the first dielectric layer 106, and it is surrounded by the diffusion barrier layer 202. The capping layer 206 is located over the diffusion barrier layer 202 and the conductive feature 204.

The conductive feature 204 is made of conductive materials, such as copper (Cu), copper alloy, aluminum (Al), aluminum alloys, or combinations thereof. The diffusion barrier layer 202 is used to prevent diffusion of the metal material of the conductive feature 204 into the first dielectric layer 106. The diffusion barrier layer 202 may be made of titanium (Ti), titanium nitride (TiN), tantalum (Ta), tantalum nitride (TaN), or aluminum nitride (AlN). For example, conductive feature 204 is made of copper, and the diffusion barrier layer 202 includes TaN/Ta bi-layer.

The capping layer 206 is configured to improve the stress durability and the electron mobility of the semiconductor device 100b. In some embodiments, the capping layer 206 is made of Ni, NiB, NiWB, Co, CoWB, CoWP, or NiReP.

The top layer 228 and the middle layer 226 of the second photoresist structure 220 are sequentially patterned to form the patterned top layer 228 and the patterned middle layer 226.

Figure 2B:
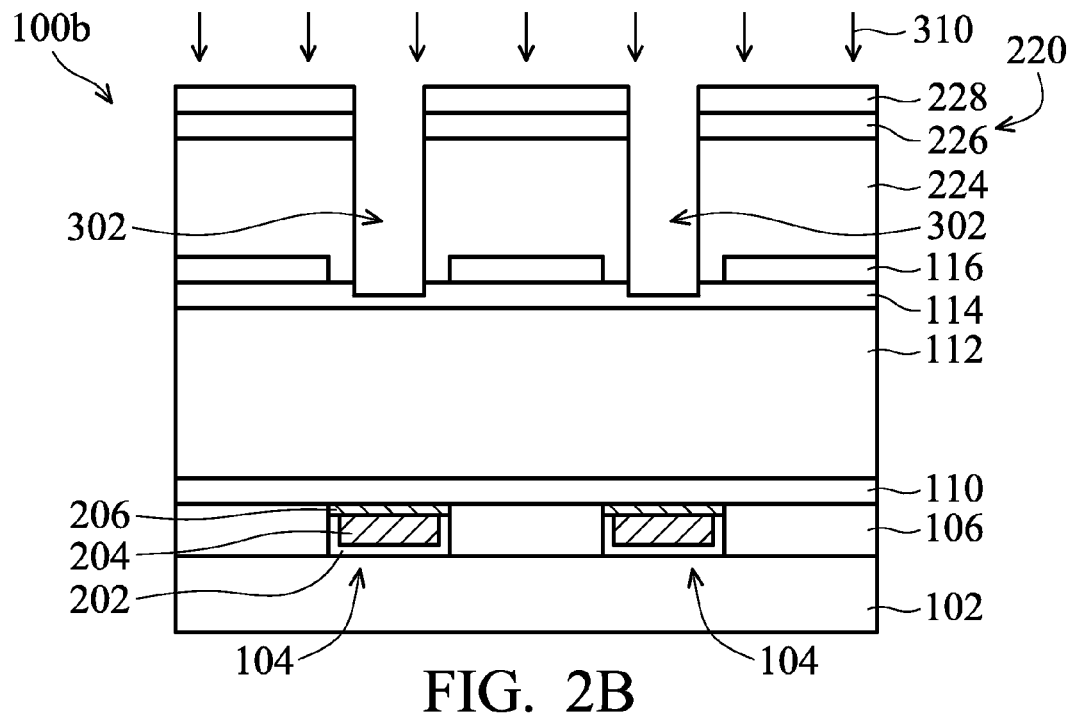

Afterwards, a portion of the bottom layer 224 and a portion of antireflection layer 114 are removed as shown in FIG. 2B, in accordance with some embodiments of the disclosure. The portion of antireflection layer 114 is removed by the first etching process 310 to form the recess 302.

Figure 2C:
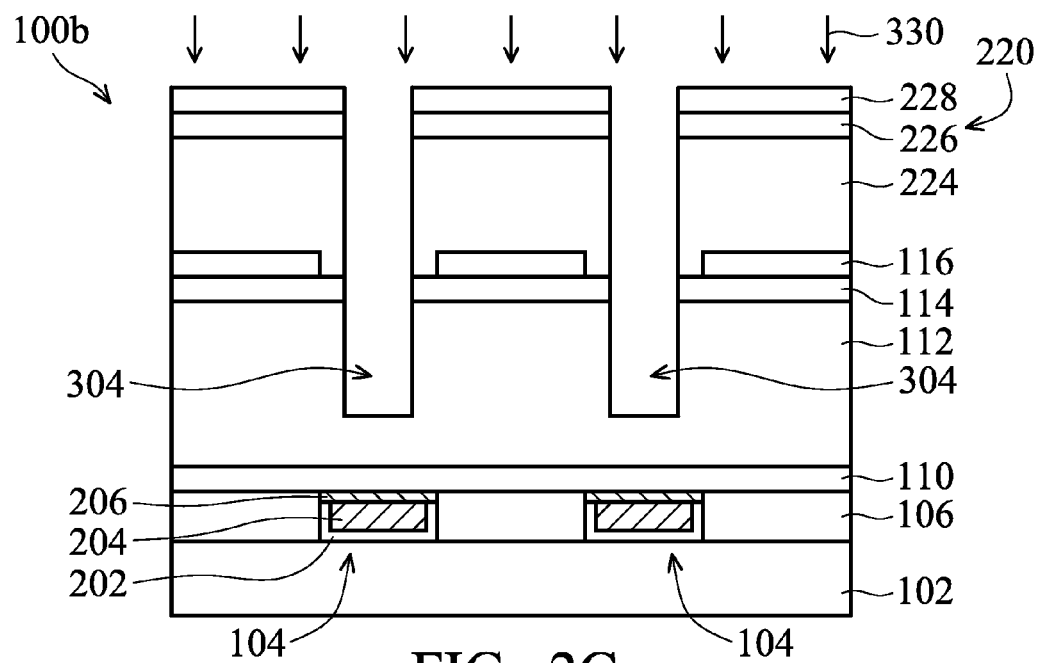

After the first etching process 310, the antireflection layer 114 is etched through and a portion of the second dielectric layer 112 is removed by the second etching process 330 as shown in FIG. 2C, in accordance with some embodiments of the disclosure. As a result, the recess 302 is elongated to form the opening 304.

Figure 2D:
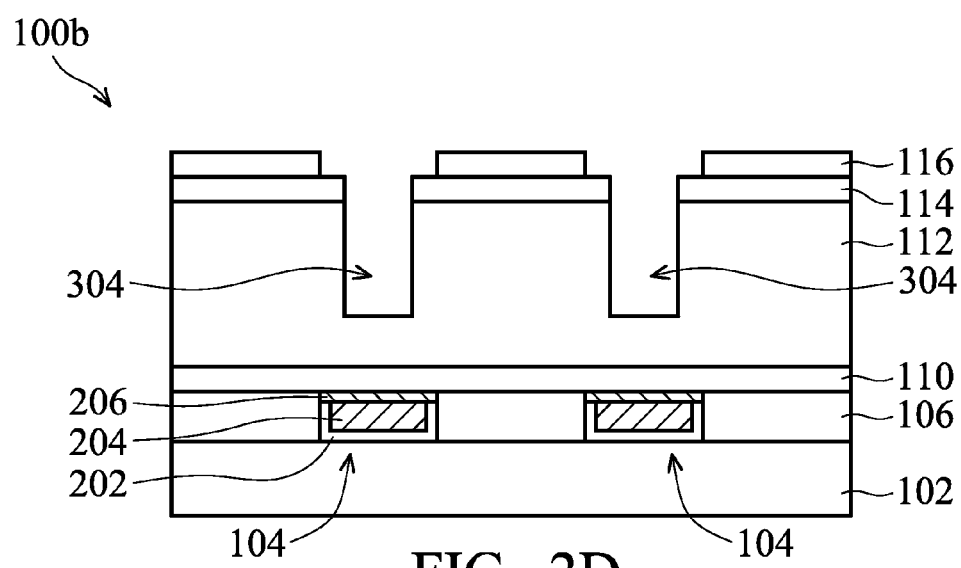

Afterwards, the second photoresist structure 220 is removed as shown in FIG. 2D, in accordance with some embodiments of the disclosure. Therefore, the patterned hard mask layer 116 is exposed.

Figure 2E:
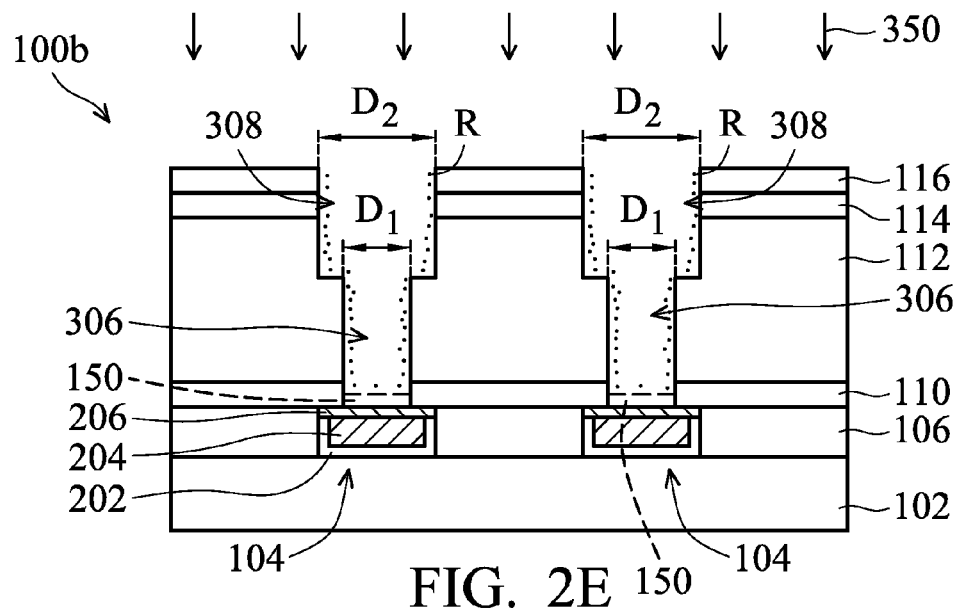

After the second photoresist structure 220 is removed, the second dielectric layer 112 and the etch stop layer 110 are etched through to expose the capping layer 206 by the third etching process 350 as shown in FIG. 2E, in accordance with some embodiments of the disclosure.

However, the metal oxide layer 150, such as aluminum oxide ($Al_xO_y$) or aluminum-fluoride oxide ($Al_xF_yO_z$)), may form over the etch stop layer 110. In addition, some residue R or by-products may form over the etch stop layer 110, the capping layer 206 and the sidewalls of the via portion 306 and the trench portion 308.

However, if the metal oxide layer 150 and the residues R accumulate on the etch stop layer 110, the conductive path may be blocked. It means that the conductive material (formed later) cannot electrically connect to the first metal layer 104. As a result, the resistance of the interconnect structure may be increased.

Figure 2F:
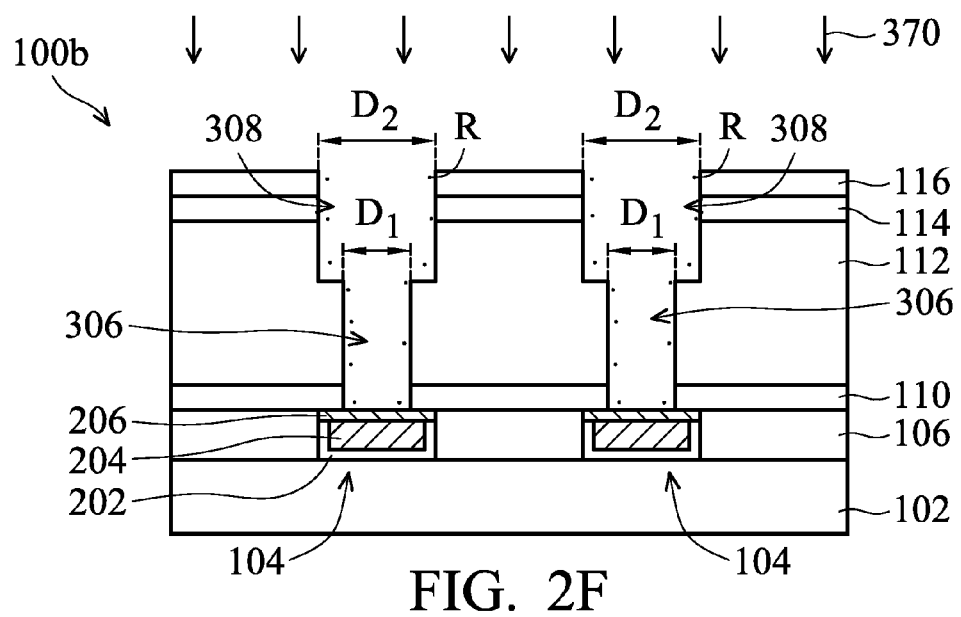

In order to resolve the above-mentioned problem, the plasma cleaning process 370 is performed on the via portion 306, the trench portion 308, the etch stop layer 110, the adhesion layer 111, the second dielectric layer 112 and antireflection layer 114 and hard mask layer 116 as shown in FIG. 2F, in accordance with some embodiments of the disclosure. After the plasma cleaning process 370, the metal oxide layer 150 is removed and most of the residues R are removed.

The plasma cleaning process 370 is performed by using a plasma including nitrogen gas ($N_2$) and hydrogen gas ($H_2$). The nitrogen gas is used to break or bombard some bonds in the metal oxide layer 150 and the residues R. The hydrogen gas is used to reduce the metal oxide layer 150 and the residues R. More specifically, the metal oxide layer 150 and the residues R are reduced by using the hydrogen gas as a reducing agent.

Afterwards, the diffusion barrier layer 140 and the conductive feature 142 is filled into the via portion 306, the trench portion 308 as shown in FIG. 2G, in accordance with some embodiments of the disclosure.

The conductive feature 142 is formed in the second dielectric layer 112, and it is surrounded by the diffusion barrier layer 140. The conductive structure 145 is formed by filling the diffusion barrier layer 140 and the conductive feature 142 in the trench-via structure. The conductive feature 142 is electrically connected to the capping layer 206 of the first metal layer 104. The first metal layer 104 embedded in the first dielectric layer 106 and the conductive feature 142 embedded in second dielectric layer 112 construct a portion of the interconnect structure.

FIGS. 3A-3F show cross-sectional representations of various stages of forming a semiconductor device structure 100c with an interconnect structure, in accordance with some embodiments of the disclosure. Semiconductor structure 100c is similar to, or the same as, semiconductor structure 100 as shown in FIG. 1N, except the first metal layer 104 includes the conductive feature 204 and the capping layer 206. In addition, a buffer layer 113 is not used in the semiconductor structure 100c. Processes and materials used to form semiconductor structure 100c may be similar to, or the same as, those used to form semiconductor structure 100 and are not repeated herein.

Figure 3A:
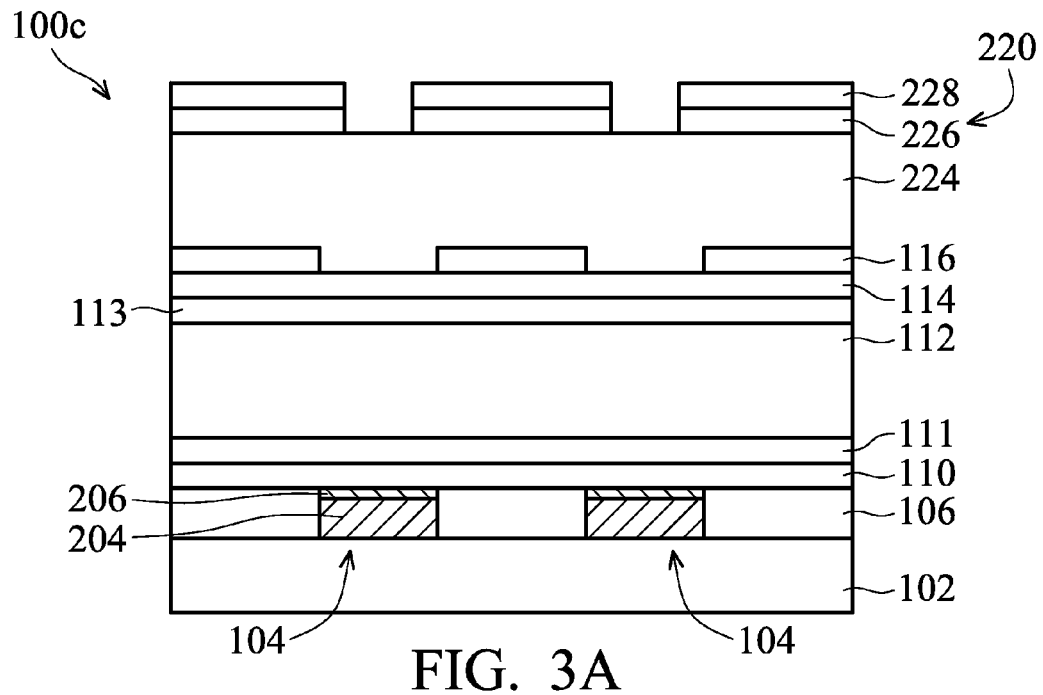
FIGS. 3A-3F show cross-sectional representations of various stages of forming a semiconductor device structure with an interconnect structure, in accordance with some embodiments of the disclosure.

As shown in FIG. 3A, the capping layer 206 is formed over the conductive feature 204. The buffer layer 113 is formed between the second dielectric layer 112 and the antireflection layer 114. In some embodiments, the buffer layer 113 is made of silicon nitride.

Figure 3B:
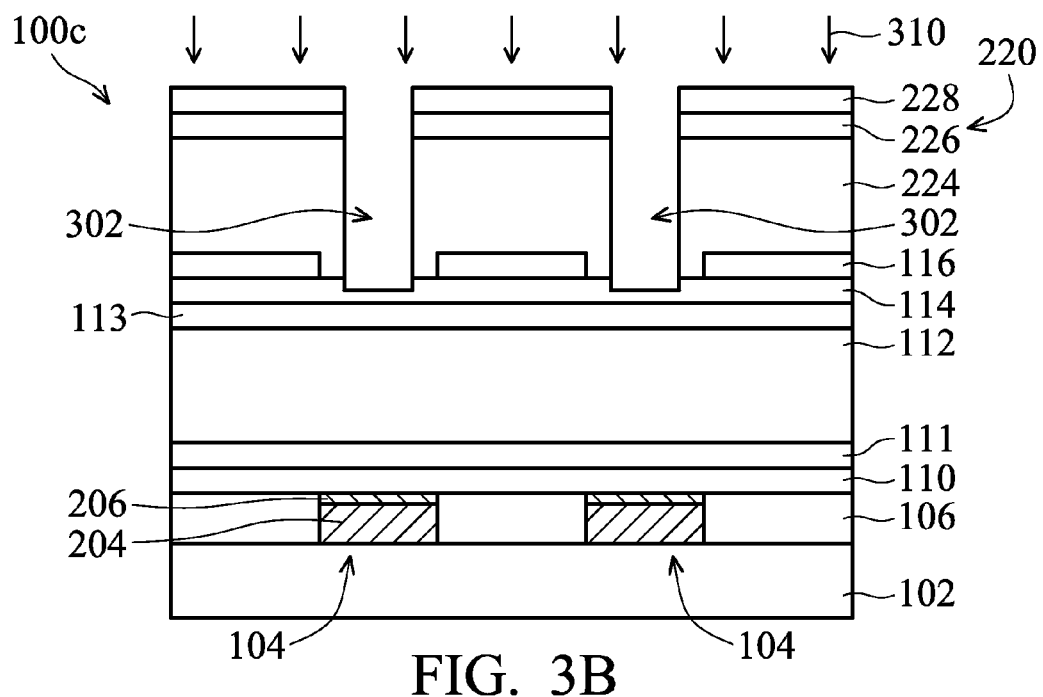

Afterwards, the portion of antireflection layer 114 is removed by the first etching process 310 as shown in FIG. 3B, in accordance with some embodiments of the disclosure.

Figure 3C:
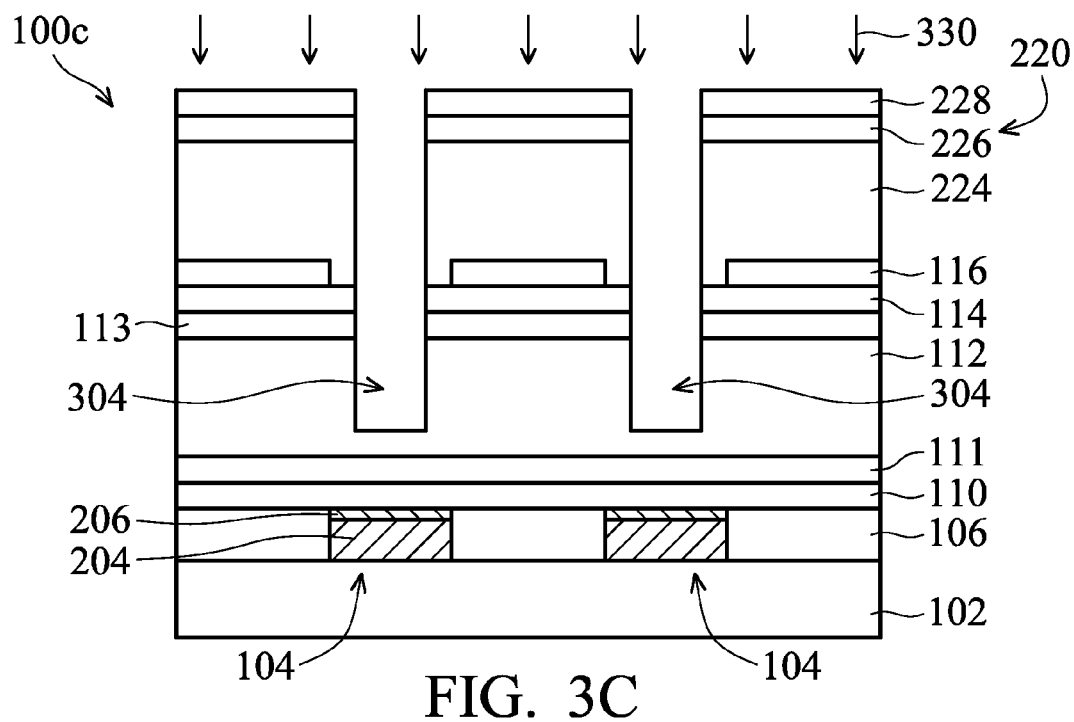

Afterwards, a portion of the buffer layer 113 and a portion of the antireflection layer 114 are removed as shown in FIG. 3C, in accordance with some embodiments of the disclosure. The etch rate of the buffer layer 113 is between an etch rate of the antireflection layer 114 and an etch rate of the dielectric layer 112. Therefore, while performing the second etching process 330, the etching profile of the second dielectric layer 112 may be well controlled.

Figure 3D:
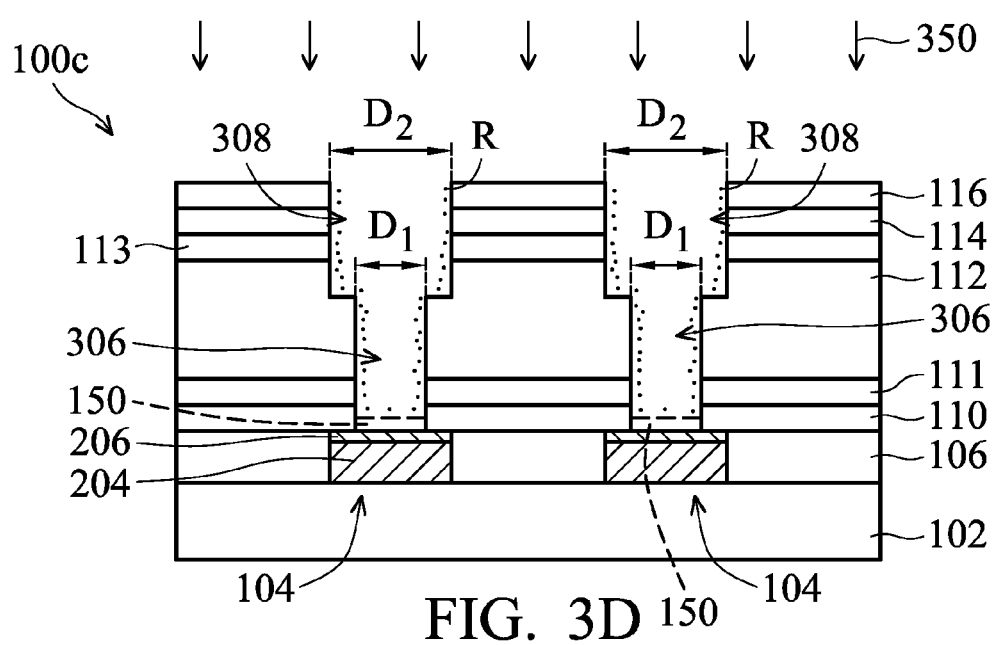

Afterwards, the second photoresist structure 220 is removed, and then the second dielectric layer 112, the adhesion layer 111 and the etch stop layer 110 are etched through to expose the capping layer 206 by the third etching process 350 as shown in FIG. 3D, in accordance with some embodiments of the disclosure.

Figure 3E:
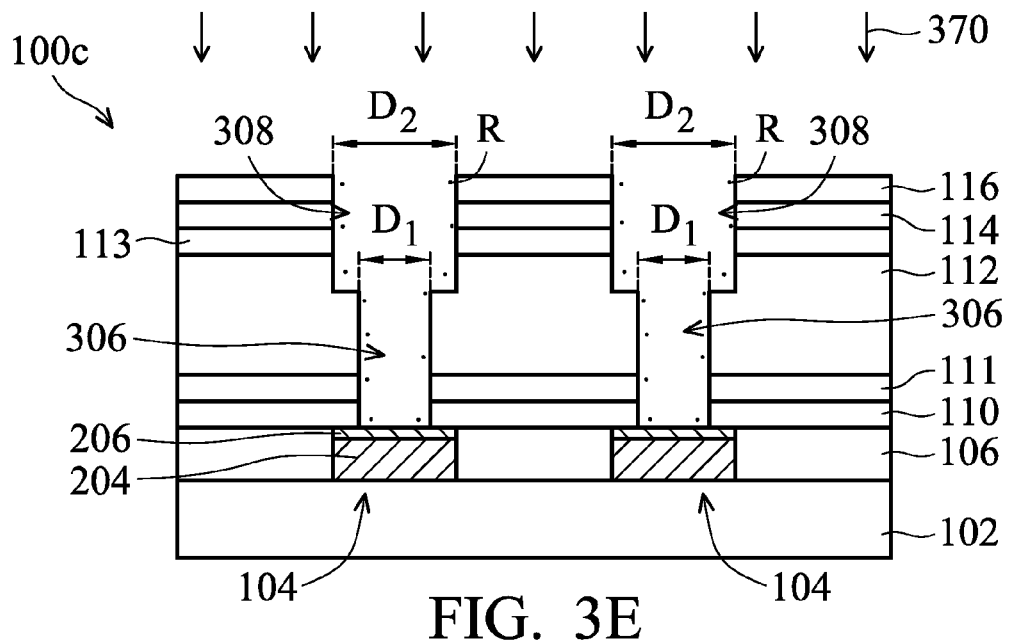

Afterwards, the plasma cleaning process 370 is performed as shown in FIG. 3E, in accordance with some embodiments of the disclosure. After the plasma cleaning process 370, the metal oxide layer 150 is removed and most of the residues R are removed.

Figure 3F:
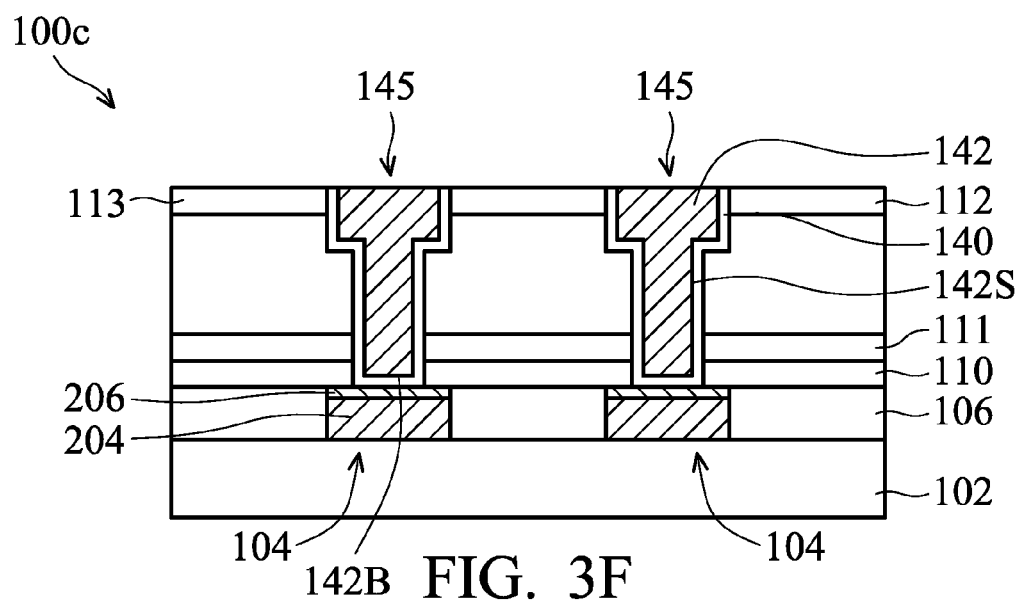

Afterwards, the diffusion barrier layer 140 and the conductive feature 142 is filled into the via portion 306, the trench portion 308 as shown in FIG. 3F, in accordance with some embodiments of the disclosure.

As mentioned above, the metal oxide layer 150 and the residues are removed by the plasma etching process. As a result, the bottom portion of the via portion 306 is not blocked by the metal oxide layer 150. Therefore, the contacting area between the conductive feature 142 and the first metal layer 104 is increased.

Embodiments for forming a semiconductor device structure and method for formation the same are provided. The semiconductor device structure includes an interconnect structure is formed over a substrate. The interconnect structure includes a dual damascene structure. During forming the interconnect structure, some residues may form on the bottoms or sidewalls of a via or a trench. A plasma cleaning process including nitrogen gas ($N_2$) and hydrogen gas ($H_2$) is performed to remove the residues. Therefore, the performance of the semiconductor device structure is improved.

In some embodiments, a method for forming a semiconductor device structure is provided. The method includes forming a metal layer in a first dielectric layer over a substrate and forming an etch stop layer over the metal layer. The etch stop layer is made of metal-containing material. The method also includes forming a second dielectric layer over the etch stop layer and removing a portion of the second dielectric layer to expose the etch stop layer and to form a via by an etching process. The method further includes performing a plasma cleaning process on the via and the second dielectric layer, and the plasma cleaning process is performed by using a plasma including nitrogen gas ($N_2$) and hydrogen gas ($H_2$).

In some embodiments, a method for forming a semiconductor device structure is provided. The method includes forming an etch stop layer over a substrate, and the etch stop layer is made of aluminum-containing material. The method also includes forming a dielectric layer over the etch stop layer and forming an antireflection layer over the dielectric layer. The method further includes forming a hard mask layer over the antireflection layer and forming a patterned photoresist layer over the hard mask layer. The method includes etching a portion of the antireflection layer by using the patterned photoresist layer as a mask and by performing a first etching process and etching through the antireflection layer and etching a portion of the dielectric layer by performing a second etching process to form an opening in the dielectric layer. The method includes etching through the dielectric layer and the etch stop layer by performing a third etching process to form a via portion and performing a plasma cleaning process on the via and the second dielectric layer. The plasma cleaning process is performed by using a plasma comprising nitrogen gas ($N_2$) and hydrogen gas ($H_2$).

In some embodiments, a method for forming a semiconductor device structure is provided. The method includes forming a metal layer over a substrate and forming an etch stop layer over the metal layer. The etch stop layer is made of aluminum-containing material. The method also includes forming a dielectric layer over the etch stop layer and removing a portion of the dielectric layer to expose the etch stop layer and to form a via. A metal oxide layer is formed on the etch stop layer and the sidewalls of the via. The method also includes performing a plasma cleaning process to remove the metal oxide layer, and the plasma cleaning process is performed by using a plasma comprising nitrogen gas ($N_2$) and hydrogen gas ($H_2$).

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:
   forming a metal layer in a first dielectric layer over a substrate;
   forming an etch stop layer over the metal layer, wherein the etch stop layer is made of aluminum-containing insulating material;
   forming a second dielectric layer over the etch stop layer
   removing a portion of the second dielectric layer to expose the etch stop layer and to form a via by an etching process; and
   performing a plasma cleaning process on the via and the second dielectric layer, wherein the plasma cleaning process is performed by using a plasma comprising nitrogen gas ($N_2$) and hydrogen gas ($H_2$).

2. The method for forming the semiconductor device structure as claimed in claim 1, wherein a ratio of the flow rate of nitrogen gas ($N_2$) to the flow rate of hydrogen gas ($H_2$) is in a range from about 2/1 to about 4/1.

3. The method for forming the semiconductor device structure as claimed in claim 1, further comprising:
   after the plasma cleaning process, performing a wet cleaning process on the second dielectric layer.

4. The method for forming the semiconductor device structure as claimed in claim 1, wherein the etching process is performed by using an etch gas comprising fluorine-containing gas.

5. The method for forming the semiconductor device structure as claimed in claim 1, wherein the etching process and the plasma cleaning process are performed in the same chamber.

6. The method for forming the semiconductor device structure as claimed in claim 1, further comprising:
   forming a barrier layer under the metal layer, wherein the metal layer is surrounded by the barrier layer; and
   forming a capping layer over the metal layer.

7. The method for forming the semiconductor device structure as claimed in claim 1, further comprising:
   filling a conductive material into the via to form a conductive structure, wherein the conductive structure is electrically connected to the metal layer.

8. The method for forming the semiconductor device structure as claimed in claim 1, wherein the aluminum-containing insulating material is aluminum nitride.

9. The method for forming the semiconductor device structure as claimed in claim 1, wherein the aluminum-containing insulating material is aluminum oxide.

10. The method for forming the semiconductor device structure as claimed in claim 1, wherein the aluminum-containing insulating material is aluminum oxynitride.

11. A method for forming a semiconductor device structure, comprising:
    forming an etch stop layer over a substrate, wherein the etch stop layer is made of aluminum-containing insulating material;
    forming a dielectric layer over the etch stop layer;
    forming an antireflection layer over the dielectric layer;
    forming a hard mask layer over the antireflection layer;
    forming a patterned photoresist layer over the hard mask layer;
    etching a portion of the antireflection layer by using the patterned photoresist layer as a mask and by performing a first etching process;
    etching through the antireflection layer and etching a portion of the dielectric layer by performing a second etching process to form an opening in the dielectric layer; and
    etching through the dielectric layer and the etch stop layer by performing a third etching process to form a via portion; and
    performing a plasma cleaning process on the via and the dielectric layer, wherein the plasma cleaning process is performed by using a plasma comprising nitrogen gas ($N_2$) and hydrogen gas ($H_2$).

12. The method for forming the semiconductor device structure as claimed in claim 11, wherein a ratio of the flow rate of nitrogen gas ($N_2$) to the flow rate of hydrogen gas ($H_2$) is in a range from about 2/1 to about 4/1.

13. The method for forming the semiconductor device structure as claimed in claim 11, further comprising:
    after the plasma cleaning process, performing a wet cleaning process over the dielectric layer.

14. The method for forming the semiconductor device structure as claimed in claim 13, wherein the first etching process, the second etching process, the third etching process and the plasma cleaning process are performed in the same chamber.

15. The method for forming the semiconductor device structure as claimed in claim 11, further comprising:
    forming a buffer layer between the dielectric layer and the antireflection layer, wherein during the second etching process, an etch rate of the buffer layer is between an etch rate of the antireflection layer and an etch rate of the dielectric layer.

16. The method for forming the semiconductor device structure as claimed in claim 11, further comprising:
    forming a metal layer over a substrate; and
    forming a capping layer on the metal layer, wherein the etch stop layer is formed directly on the capping layer.

17. The method for forming the semiconductor device structure as claimed in claim 11, further comprising:
    patterning the hard mask layer to form a patterned hard mask layer; and
    pattering the dielectric layer by the patterned hard mask layer, such that a trench portion over the via portion is formed while performing the third etching process.

18. The method for forming the semiconductor device structure as claimed in claim 17, further comprising:
    filling a conductive material into the via portion and the trench portion to form a dual damascene structure.

19. The method for forming the semiconductor device structure as claimed in claim 11, wherein a metal oxide layer is formed on the etch stop layer after performing the third etching process, and the plasma cleaning process is configured to remove the metal oxide layer.

20. A method for forming a semiconductor device structure, comprising:
   forming a metal layer over a substrate;
   forming an etch stop layer over the metal layer, wherein the etch stop layer is made of aluminum-containing insulating material;
   forming a dielectric layer over the etch stop layer;
   removing a portion of the dielectric layer to expose the etch stop layer and to form a via, wherein a metal oxide layer is formed on the etch stop layer and the sidewalls of the via; and
   performing a plasma cleaning process to remove the metal oxide layer, wherein the plasma cleaning process is performed by using a plasma comprising nitrogen gas ($N_2$) and hydrogen gas ($H_2$).

21. The method for forming the semiconductor device structure as claimed in claim 20, further comprising:
   forming an adhesion layer between the etch stop layer and the dielectric layer.

22. The method for forming the semiconductor device structure as claimed in claim 20, wherein the plasma cleaning process is operated at a temperature in a range from about 10 degrees to about 100 degrees.

23. The method for forming the semiconductor device structure as claimed in claim 20, wherein a ratio of the flow rate of nitrogen gas ($N_2$) to the flow rate of hydrogen gas ($H_2$) is in a range from about 2/1 to about 4/1.

* * * * *